(12) United States Patent
Sweatt et al.

(10) Patent No.: US 6,875,544 B1
(45) Date of Patent: Apr. 5, 2005

(54) METHOD FOR THE FABRICATION OF THREE-DIMENSIONAL MICROSTRUCTURES BY DEEP X-RAY LITHOGRAPHY

(75) Inventors: William C. Sweatt, Albuquerque, NM (US); Todd R. Christenson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 190 days.

(21) Appl. No.: 10/264,536

(22) Filed: Oct. 3, 2002

(51) Int. Cl.$^7$ .................. H01L 21/027; G03F 1/16; G03F 9/00
(52) U.S. Cl. ............... 430/5; 430/14; 430/322; 378/35
(58) Field of Search .................. 430/5, 22, 313, 430/14; 378/35

(56) References Cited

U.S. PATENT DOCUMENTS

| | | | |
|---|---|---|---|
| 5,045,439 A | | 9/1991 | Maner et al. |
| 5,576,147 A | * | 11/1996 | Guckel et al. ............. 430/313 |
| 5,679,502 A | | 10/1997 | Siddons et al. |
| 5,866,281 A | * | 2/1999 | Guckel et al. ............... 430/22 |
| 6,080,514 A | * | 6/2000 | Choi ............................. 430/5 |
| 6,252,725 B1 | * | 6/2001 | Tran et al. ................ 359/811 |

OTHER PUBLICATIONS

Sweatt, et al., "Microoptical System and Fabrication Method Therfor", U.S. Appl. No. 09/742,778, filed Dec. 20, 2000.
Yablonovitch, et al., "Photonic Band Structure: The Face–Centered–Cubic Case Employing Nonspherical Atoms" *Phys. Rev. Lett.* 67(17), 2295 (1991).
Feiertag, et al., "Fabrication of photonic crystals by deep x–ray lithography," *Appl. Phys. Lett.* 71, 1441 (1997).
Ehrfeld, et al., "Recent developments in deep x–ray lithography," *J. Vac. Sci. Technol. B* 16(6), 3526 (1998).
Ehrfeld, et al., "Materials of LIGA technology," *Microsystems Technologies 5,* 105 (1999).
Cuisin, et at., "Fabrication of three–dimensional microstructures by high resolution x–ray lithography," *J. Vac. Sci. Technol. B* 17(6), 3444 (1999).
Luttge, et al., "40 keV Shaped Electron Beam Lithography for LIGA Intermediate Mask Fabricaton," *Microelectronic Engineering 46,* 247 (1999).
Cuisin, et al., "Fabrication of three–dimensional photonic structures with submicrometer resolution by x–ray lithography," *J. Vac. Sci. Technol B* 18(6), 3505 (2000).
Cuisin, et al., "Submicrometer resolution Yablonovite templates fabricated by x–ray lithography," *Appl. Phys. Lett.* 77(6), 770 (2000).
Oh, et al., "A tetrahedral three–facet micro mirror with the inclined deep X–ray process," *Sensors and Actuators A 93,* 157 (2001).
Schmidt, et al., "High precision mask fabrication for deep X–ray lithography using 40–kV shaped electron beam lithography," *Microelectronic Engineering 57,* 761 (2001).
Cuisin, et al., "Sub–micrometre dielectric and metallic yablonovite structures fabricated from resist templates," *Optical and Quantum Electronics 13* (2002).

* cited by examiner

*Primary Examiner*—John L Goodrow
(74) *Attorney, Agent, or Firm*—Kevin W. Bieg

(57) ABSTRACT

A method for the fabrication of three-dimensional microstructures by deep X-ray lithography (DXRL) comprises a masking process that uses a patterned mask with inclined mask holes and off-normal exposures with a DXRL beam aligned with the inclined mask holes. Microstructural features that are oriented in different directions can be obtained by using multiple off-normal exposures through additional mask holes having different orientations. Various methods can be used to block the non-aligned mask holes from the beam when using multiple exposures. A method for fabricating a precision 3D X-ray mask comprises forming an intermediate mask and a master mask on a common support membrane.

29 Claims, 8 Drawing Sheets

METHOD FOR THE FABRICATION OF THREE-DIMENSIONAL MICROSTRUCTURES BY DEEP X-RAY LITHOGRAPHY

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to photolithography and, in particular, to a method for the fabrication of three-dimensional microstructures by deep X-ray lithography.

BACKGROUND OF THE INVENTION

X-ray lithography (XRL) has proven to possess great utility in microstructural fabrication. In particular, deep X-ray lithography (DXRL) uses highly collimated x-rays, with energies on the order of several keV, to precisely and accurately transfer a mask pattern into a thick photoresist to define high-aspect-ratio microstructures. Furthermore, LIGA technology (the German acronym for Lithographie, Galvanoformung, and Abformung) combines DXRL with electroplating and plastic molding to enable high volume production of microcomponents from a wide variety of materials, including polymers, metals, alloys, and ceramics. A typical LIGA-based microfabrication process comprises exposing a photoresist to a collimated beam of high energy x-rays through a patterning mask, developing the photoresist to provide a mold, electrodepositing a structural material into the voids of the mold, planarizing the exposed surface of the electrodeposit, and removing the mold to yield the microcomponent.

Prismatically shaped microstructures with nearly arbitrary in-plane geometry and structural heights of several hundred microns to millimeters can thereby be fabricated with sub-micron dimensional control.

The quality of the results obtained from DXRL-assisted microfabrication is largely determined by the fidelity of the X-ray mask pattern. An X-ray mask consists of an X-ray absorbing layer patterned on a support membrane that is substantially transparent to X-rays. The transparent support membrane can typically be a low-atomic-number material, such as beryllium, carbon, boron nitride, boron carbide, silicon, silicon nitride, or silicon carbide, with thickness of less than 100 $\mu$m. The patterned mask absorber contains the information to be imaged onto the photoresist. The absorber is typically a dense, high-atomic-number material, such as gold or tungsten, to attenuate the high energy X-rays in the masked regions.

The requirements of the X-ray absorber are determined by the minimum required exposure contrast, defined as the exposure dose at the photoresist bottom surface in the unmasked exposed regions divided by the exposure dose delivered to the photoresist top surface in the unexposed regions under the is absorber. Exposure contrast is a function of the X-ray source, mask support membrane, mask absorber, and the sensitivity and thickness of the exposed photoresist. Because of the nature of the X-ray absorption, DXRL absorbers are typically much thicker than those used in the integrated circuits industry. In particular, the greater the thickness of the exposed photoresist, the thicker must be the absorber in order to maintain good contrast (e.g., greater than 10) in the photoresist. For a low energy (e.g., several keV) synchrotron X-ray source exposing a several hundred microns thick PMMA photoresist, a gold absorber can have a thickness of several microns or more.

The exposure contrast for a given set of X-ray source parameters, mask absorber and support membrane thicknesses, and photoresist thickness can be obtained using standard models of X-ray attenuation in matter. These attenuation models describe one-dimensional, multi-wavelength transmission through an arbitrary set of X-ray beam filters, transmission through the mask absorber and support membrane, and the subsequent photon flux in the masked and unmasked regions through the photoresist layer thickness.

Recently, there has been increased emphasis on three-dimensional (3D) microstructures, such as are required for 3D photonic crystals and some microoptical elements. Such 3D microstructures, having non-vertical features, can be fabricated by conventional DXRL-assisted processes by using off-normal exposures through a patterned mask. Changing the angle of incidence of the X-ray beam on the photoresist thereby enables the fabrication of non-vertical features having inclined sidewalls. See Ehrfeld et al., "Recent developments in deep x-ray lithography," *J. Vac. Sci. Technol.* B16(6), 3526 (1998) and U.S. Pat. No. 5,045,439 to Maner et al.

The 3D mask can either be a proximity mask, with the mask in contact or spaced slightly away from the surface of the photoresist layer, or it can be inclined relative to the plane of the photoresist. Inclined masks can be operationally difficult, particularly when multiple off-normal exposures are required. Using an off-normal exposure geometry with vertical mask holes in a proximity mask works adequately to fabricate many acceptable 3D microstructures. However, the use of vertical mask holes in a thick proximity mask with off-normal exposures can cause absorber shadowing, leading to poor pattern transfer to the photoresist and, therefore, 3D microstructures having geometrically distorted features and tapered sidewalls.

The present invention solves these problems by providing a proximity mask with non-vertical mask holes that are inclined in the direction of the off-normal X-ray beam used to expose the photoresist. The non-vertical mask holes eliminate the geometric distortion and poor sidewall definition caused by absorber shadowing. For multiple off-normal exposures, the mask can be repositioned to realign the mask holes for each subsequent exposure geometry. Alternatively, separate lithographic masks, with different mask hole orientations, can be exchanged between exposures. Alternatively, a master mask can have a plurality of mask holes with different orientations. The aligned mask holes of the master mask can be selected for each exposure with an X-ray blocking selection mask. Alternatively, the absorbing layer of an enhanced mask can be made sufficiently thick so that the X-rays do not penetrate through the absorber in the region of the non-aligned mask holes, eliminating the need for the selection mask. A method to fabricate a precision 3D mask to enable accurate pattern transfer to a thick photoresist layer is also provided.

SUMMARY OF THE INVENTION

A method for fabricating a three-dimensional microstructure comprises providing a photoresist layer on a substrate; positioning a patterned first mask proximate the surface of the photoresist layer, the first mask comprising an absorber layer with at least one mask hole that is inclined at an angle θ relative to a surface normal of the first mask; exposing the photoresist layer through the at least one mask hole to a first beam of collimated radiation that is substantially aligned with the angle of inclination θ of the at least one mask hole, thereby defining at least one latent image in the photoresist layer; and developing the photoresist layer to selectively remove or not remove the exposed regions of the photoresist layer to provide the three-dimensional microstructure. The at least one mask hole can be elongated in the plane of the first mask in the direction of the first beam of collimated radiation to compensate for the geometric distortion of the at least one latent image in the photoresist layer caused by the off-normal exposure. Multiple exposures at different tilt and/or rotation angles can be taken through additional mask holes in the same master mask or in exchanged masks to define additional latent images in the photoresist layer. The non-aligned mask holes in the master mask can be blocked during the multiple exposures by using one or more selection masks or by using a thicker, enhanced mask.

The invention further includes a method for fabricating an X-ray mask, comprising forming a support membrane that is substantially transparent to the X-rays on a mask frame, applying a first photoresist layer to a first side of the support membrane, patterning the first photoresist layer with a lithographic process, removing the exposed or unexposed regions of the first photoresist layer, filling the removed regions of the first photoresist layer with a first absorbing material to form a patterned intermediate mask having at least one mask hole, applying a negative second photoresist layer to a side of the support membrane, patterning the negative second photoresist layer by exposing the second photoresist layer to a first collimated X-ray beam through at least one mask hole of the intermediate mask, removing the unexposed regions of the second photoresist layer, filling the removed regions of the second photoresist layer with a second absorbing material, and removing the exposed regions of the second photoresist layer to form the X-ray mask.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 1 shows a prior art masking process and exposure geometry for fabricating a Yablonovite photonic crystal using DXRL-assisted microfabrication.

FIG. 2 shows the masking process and exposure geometry for fabricating a Yablonovite photonic crystal using DXRL-assisted microfabrication according to a method of the present invention.

FIG. 3 shows the masking process and exposure geometry for fabricating a Yablonovite photonic crystal using DXRL-assisted microfabrication according to a method of the present invention.

FIG. 4 shows the masking process and exposure geometry for fabricating a Yablonovite photonic crystal using DXRL-assisted microfabrication according to a method of the present invention.

FIG. 7 shows a method for fabricating a precision 3D X-ray mask, whereby an intermediate mask and a master mask are fabricated on a common support membrane.

DETAILED DESCRIPTION OF THE INVENTION

The present invention is directed to an improved masking process for the fabrication of 3D microstructures using off-normal exposures through a mask having mask holes inclined in the direction of the DXRL beam. The masking processes and exposure geometries of the present invention are particularly well suited to the LIGA-based fabrication of high quality, high-aspect-ratio 3D microstructures. Although the methods of the present invention are generally applicable to the fabrication of any 3D microstructure, the objects and advantages of the methods of the present invention are conveniently-illustrated hereinafter by reference to the fabrication of Yablonovite, the first 3D photonic crystal to exhibit a complete photonic bandgap. The use of the Yablonovite example is not intended to limit the scope of the invention.

The original Yablonovite structure consists of air holes drilled in a slab of dielectric through a mask comprising a triangular array of mask holes. Each mask hole is drilled three times, at a tilt angle of 35.26° away from the normal, and spread out 120° on the azimuth. The air holes simulate the <110>, <011>, and <101>directions arranged symmetrically about the normal <111>direction of the face-centered-cubic (fcc) diamond lattice. Therefore, the planes formed by the intersections of the drilled holes correspond to the (111) diamond lattice planes. Yablonovite structures with about 78% void fraction (i.e., r=0.234a, where r is the hole diameter and a is the fcc lattice period) have been shown to exhibit a complete photonic bandgap at microwave frequencies using a high-permittivity dielectric as the slab material.

In principle, the Yablonovite structure can be scaled to exhibit a complete photonic bandgap at other frequencies by modifying the lattice period and refractive index contrast of the photonic crystal materials. In particular, to obtain a wavelength of peak reflectivity $\lambda_{peak}$, the period of the diamond lattice needs to be about $\lambda_{peak}/3$ Recently, attempts have been made to fabricate Yablonovite-type structures that exhibit a complete photonic bandgap at optical wavelengths using LIGA-based microfabrication processes. Cuisin et al., "Sub-micrometre dielectric and metallic yablonovite structures fabricated from resist templates," *Optical and Quantum Electronics* 34, 13 (2002).

Figure 1B:
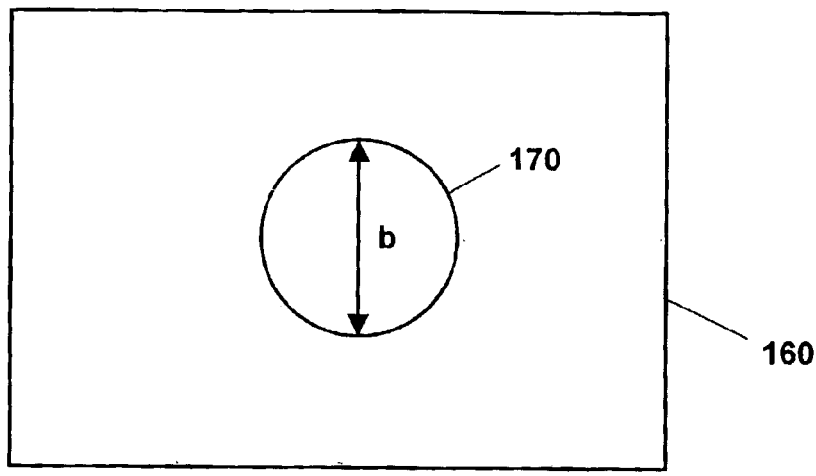
FIG. 1B shows a schematic top view of the mask.
Figure 1A:
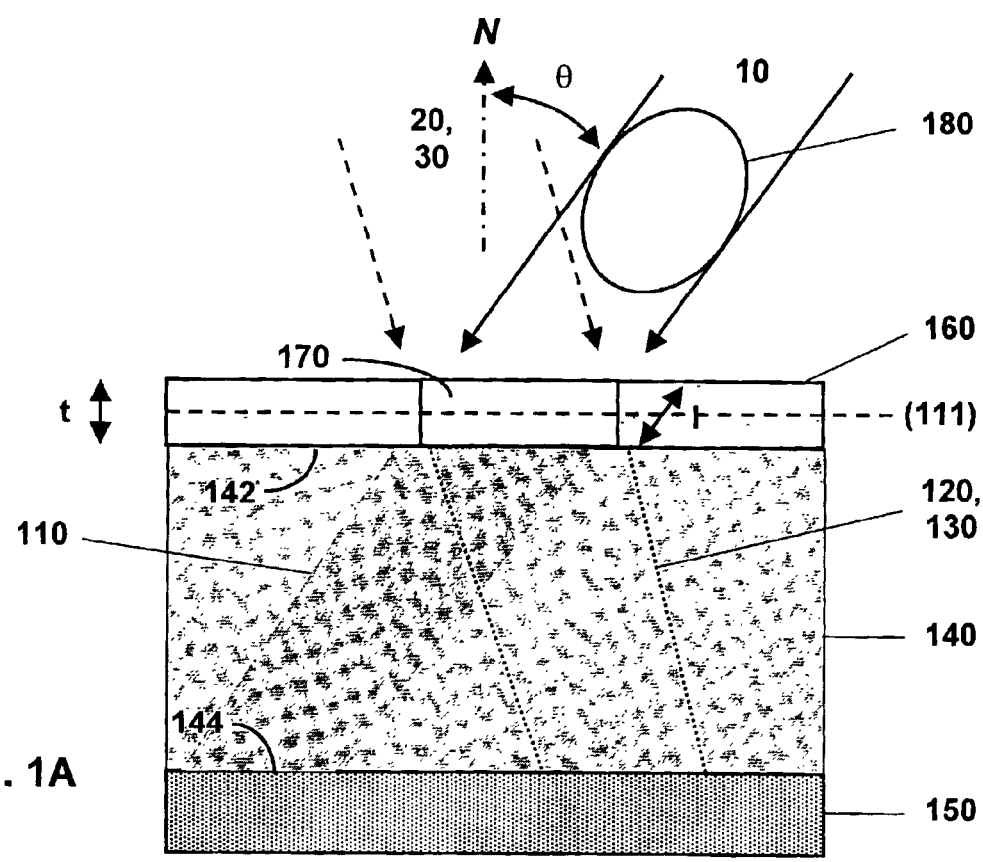
FIG. 1A shows a schematic elevation view of the latent images of elliptical holes is defined in a photoresist layer using three consecutive off-normal DXRL exposures through a single vertical circular mask hole in a mask.

In FIG. 1A is shown the prior art masking process and exposure geometry of Cuisin et al. for fabricating optical Yablonovite in a photoresist layer 140 on a substrate 150. If the substrate 150 is an insulating material, the surface of the substrate can further comprise a thin electrically conductive layer for subsequent electrodeposition of a material into the voids of the Yablonovite mold. The mask 160 can be a proximity mask that is in contact or spaced slightly away from the surface 142 of the photoresist layer 140. For illustration purposes, only the absorbing layer of the mask 160 is shown in FIG. 1A. Furthermore, only a single mask hole 170 is shown in FIG. 1B. A Yablonovite mask would actually comprise a triangular array of such mask holes 170 in order to image the diamond-like lattice of the Yablonovite photonic crystal.

Similarly to the original hole-drilling approach, an air hole structure can be fabricated in the photoresist layer 140 using three consecutive off-normal exposures to collimated X-ray beams through the mask 160 comprising a triangular array of vertical circular mask holes 170. A first exposure is made with a first beam of collimated radiation 10 tilted 35.26° away from the surface normal N (i.e., in the <110>direction), thereby defining a first latent image 110 in the photoresist layer 140. Two subsequent exposures 20 and 30, also tilted 35.26° to the surface normal N but spread out 120° azimuthally from the first exposure 10 and from each other (i.e., in the <101>and <011>directions), define two additional latent images 120 and 130 in the photoresist layer 140. Because the three exposures 10, 20, and 30 are in the crystallographic directions <110>, <101>, and <011>and the latent images 120, 130, and 140 intersect at the mask hole 170, the plane of the mask 160 defines a (111) plane of the Yablonovite lattice (i.e., the surface normal N is in the <111>direction). After all three of the latent images 110, 120, and 130 are defined, a developer is applied which, in the case of a positive photoresist, removes the exposed region, producing an array of crisscrossing elliptical air holes in the developed photoresist.

The developed photoresist can itself provide a Yablonovite photonic crystal comprising PMMA and air as the dielectric materials. Using the exposure geometry described above and a 0.7 µm thick tungsten mask, Cuisin et al. produced PMMA Yablonovite with hole diameters of 0.2–0.65 µm and hole spacings of 0.6–1.3 µm. The PMMA layer thickness was less than 10 µm, generally providing a few photonic crystal lattice periods. However, the PMMA Yablonovite did not exhibit a complete photonic bandgap, due to the poor refractive index contrast between PMMA and air. Therefore, Cuisin et al. transferred the hole pattern to a high-refractive-index dielectric (i.e., $TiO_2$) or a metal (i.e., electroplated copper) and dissolved away the remaining unexposed PMMA to provide a negative replica of the PMMA Yablonovite. The resulting "inverse Yablonovite" structure comprised crisscrossing rods of the high-refractive-index material in air.

Because the masking process and exposure geometry shown in FIG. 1 uses a vertical circular mask hole 170 in a relatively thick DXRL mask 160 with off-normal exposures 10, 20, and 30, absorber shadowing can cause poor pattern transfer to the photoresist layer 140. Therefore, the resulting 3D microstructures can have distorted features with tapered sidewalls. In particular, the microfabrication method described above for the PMMA Yablonovite example will create tapered elliptical holes 180 in the developed photoresist.

In general, the ellipticity (i.e., the ratio of the minor- to major-axis of an ellipse) of a hole 180 created in the photoresist 140 with a vertical circular mask hole 170 and an off-normal exposure will be given approximately by $$\epsilon=[(b-t(\tan\theta))\cos\theta]/b \tag{1}$$

where b is the diameter of the circular mask hole, t is the absorber thickness, and θ is the incidence angle of the DXRL beam relative to the surface normal N. For a thin mask, or a mask where the circular mask hole sidewalls are inclined parallel to the incident beam, the ellipticity ratio is simply given by:

$$\epsilon=\cos\theta \tag{2}$$

Therefore, to create a circular hole with a diameter b in the photoresist, the mask hole should preferably be an ellipse with a minor axis of length b and a major axis of length $$a=b/\cos\theta \tag{3}$$

where the major axis a of the mask hole is oriented in a direction parallel to the projection of the incident beam into the plane of the mask. The elongated mask hole thereby compensates for the geometric distortion of the latent image defined in the photoresist by the off-normal exposure.

In general, the latent image can define a cylindrical or prismatically shaped microstructure having arbitrary cross-section and size. As will be obvious to those skilled in the art, the above-described compensation method can be applied to provide mask holes for 3D microstructures of arbitrary geometry. For example, to define the latent image of a square rod in the photoresist, the mask hole can be a parallelogram that is elongated in the direction of the incident beam. If one side of the square rod lies in a plane containing the surface normal, the inclined mask hole can be a rectangular opening having a long side of length a given by Eq. (3) in the beam direction and a short side of length b equal to the length of a side of the square rod. If the square rod is perpendicular to the mask (i.e., θ=0), the mask hole can be a square opening of the same size as the cross-section of the square rod.

In addition, when using vertical mask holes in a thick mask with off-normal exposures, absorber shadowing will create image blur in the photoresist due to the variable intensity distribution of the X-ray beam passing through the edge region of the mask hole. This absorber shadowing can result in a tapered latent image in the exposed photoresist and, therefore, a tapered hole in the developed photoresist. Because the inclined mask holes of the present invention can be aligned with the DXRL beam, absorber shadowing can be avoided, thereby providing cylindrical holes with parallel sidewalls in the developed photoresist.

Figure 2B:
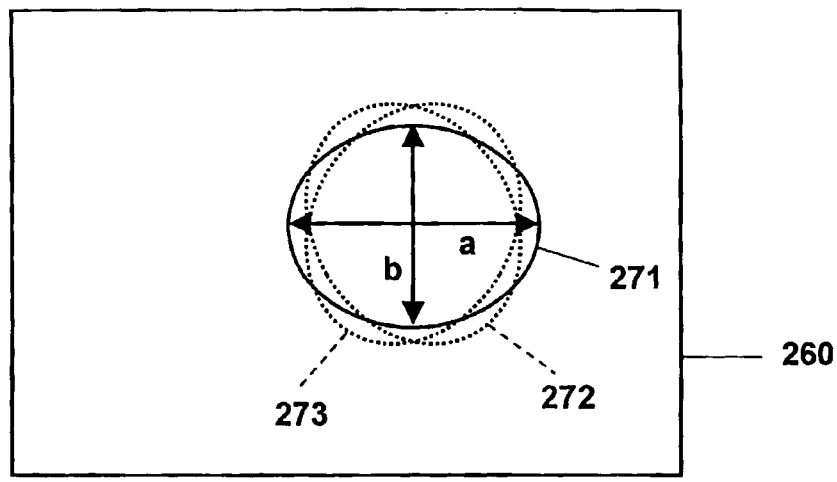
FIG. 2B shows a schematic top view of the mask.
Figure 2A:
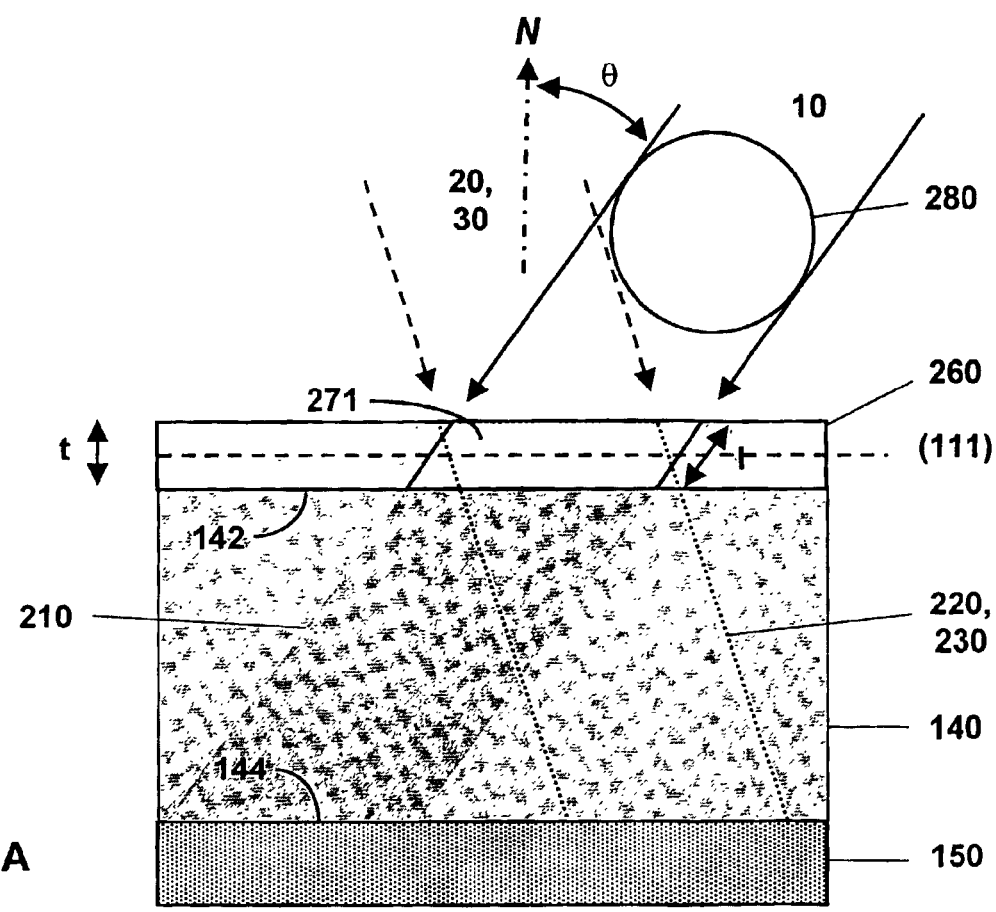
FIG. 2A shows a schematic elevation view of the latent images of circular cylindrical holes defined in a photoresist layer using three consecutive off-normal DXRL exposures through a single inclined elliptical mask hole in a mask that is repositioned between exposures.

In FIG. 2A is shown a masking process and exposure geometry of one embodiment of the present invention, comprising the method of using an inclined mask hole 271 to fabricate the exemplary Yablonovite 3D microstructure. A layer of photoresist 140, e.g., PMMA, is coated on the surface of the substrate 150. A first beam 10 is tilted at an angle θ to the surface normal N to expose the photoresist layer 140 through the patterned mask 260. Again, only the absorbing layer of the mask 260 is shown for simplicity. A method for fabricating a high precision 3D mask will be described later in this disclosure. Preferably, the mask 260 can be a proximity mask in a plane parallel to the top surface of the photoresist layer 140. The thickness t of the mask 260 is sufficient to provide good contrast between the exposed bottom and unexposed top regions of the photoresist layer 140. The mask 260 comprises at least one mask hole 271 to define at least one 3D latent image 210 in the photoresist layer 140. The sidewalls of the mask hole 271 are inclined at the angle θ parallel to the beam 10 to prevent absorber shadowing of the beam 10 in the edge regions of the mask hole 271. Further, each mask hole 271 can be elongated in the direction of the incident beam to compensate for the geometric distortion of the latent image 210 due to the off-normal exposure.

To define criss-crossing cylindrical latent images, a Yablonovite mask would actually comprise a triangular array of such inclined mask holes 271, only one of which is shown in FIG. 2B for illustrative purposes. Each mask hole 271 of the triangular array can have sidewalls inclined at the same angle of θ=35.26° away from the surface normal N and on the same azimuth, but separated by $\sqrt{2}$ fcc lattice periods from each of the other mask holes of the triangular array. To define the circular cylinders of Yablonovite, the mask holes 271 can have an elliptical cross-section with major axis a and minor axis b having relative lengths according to Eq. (3). The major axis a of the mask holes 271 is preferably oriented parallel to the projection of the beam 10 onto the plane of the mask 260. To image the Yablonovite structure according to the method depicted in FIG. 2A requires three consecutive exposures of the photoresist layer 140 to X-ray beams oriented in the <110>, <101>, and <011> directions of the diamond-like lattice. The Yablonovite mask can be rotated 120° about a normal N to the surface of the photoresist layer 140 after each exposure in order to reposition the mask holes to be aligned with the next beam direction. The Yablonovite mask can preferably be rotated 120° about a surface normal N at the center of the triangular array of mask holes, such that the rotated position of a mask hole of the triangular array will be concentric with the first position of the first mask hole, but the sidewalls of the rotated mask hole will be inclined in an azimuthal direction 120° away from those of the first mask hole.

Following this procedure, a first exposure can be taken with each mask hole of the triangular array in a first position 271 aligned with the first beam 10 (i.e., at 35.25° to the surface normal N in the <110> direction) to define a first circular cylindrical latent image 210 in the photoresist layer 140. The mask 260 can then be rotated 120° about the surface normal N so the second position 272 of a second mask hole of the triangular array is concentric with the first position 271 of the first mask hole, but oriented 120° relative to it. A second exposure can then be taken with a second beam 20 aligned with the mask holes in the second position 272 (i.e., at 35.25° to the surface normal N in the <101> is direction) to define a second cylindrical latent image 220 in the photoresist 140.

After the second exposure, the mask 260 can be rotated another 120° about the surface normal N to reposition the third mask hole of the triangular array in a third position 273 concentric with the first and second positions 271 and 272, but oriented 120° to each of the previous positions. A third exposure can then be taken with a third beam 30 aligned to the third position 273 (i.e., at 35.25° to the surface normal N in the <011> direction) to define a third cylindrical latent image 230 in the photoresist layer 140. Because each of the three positions 271, 272, and 273 of the mask holes is concentric with this exposure geometry, a (111) plane of the Yablonovite crystal will lie in the plane of the mask 260.

Alternatively, the rotated positions of the mask holes need not be concentric and the (111) lattice plane need not lie in the plane of the mask 260.

Alternatively, separate lithographic masks, each defining a different crystallographic direction, can be exchanged between the sequential X-ray exposures. In general, the exchanged mask can have mask holes with arbitrary cross-section that are inclined at a different tilt and/or azimuthal angle from the mask holes of the first mask.

After all three of the latent images 210, 220, and 230 are defined, a developer can then be applied to remove the exposed photoresist, producing an array of crisscrossing circular air holes having parallel sidewalls in the developed photoresist. The developed photoresist can be used as a mold to transfer the pattern to other Yablonovite-like structures comprising other dielectric materials, using standard LIGA technology. For example, the air holes can be filled with an electroplated material, such as copper, and the developed PMMA can be removed to replicate a copper inverse Yablonovite. Furthermore, the voids of the copper inverse Yablonovite structure can be filled with another material, such as electroplated nickel, and the copper removed to replicate a nickel Yablonovite.

Repositioning of a single mask or exchange of masks are the preferred masking processes when the microstructure features are large compared with the thickness of the mask or the features are closely spaced or overlapping in the plane of the mask. As will be apparent to those skilled in the art, this masking process and exposure geometry can be used to fabricate other closely spaced microstructures besides Yablonovite-like structures.

In general, either positive or negative photoresists can be used, so that development can remove either the exposed or the unexposed regions of the photoresist layer, respectively, to create a 3D microstructure of the photoresist materials. This 3D microstructure can provide a mold pattern that can subsequently be transferred to other materials using LIGA technology. The removed regions of the photoresist can be filled with a first replicating material. The undeveloped photoresist can then be removed to provide a negative replica of the 3D microstructure. The removed regions of the negative replica can be filled with a second replicating material. The first replicating material can be removed, for example with a selective etchant, to provide a positive replica of the 3D microstructure.

For example, the method can be used to fabricate crossed-cylindrical lenses, prisms, and other microoptical elements, as described in U.S. patent application Ser. No. 09/742,778 to Sweatt et al., filed Dec. 20, 2000, which is incorporated herein by reference. Sweatt et al. describe a microoptical system comprising multiple lines of optics on a common substrate. With five exposures, one parallel to the surface normal, two at +/−45° to the surface normal in a plane containing the surface normal, and two at +/−45° in a plane perpendicular to the first plane, microoptical elements can be made to turn a light beam in the plane parallel to the substrate, connecting various segments and centerlines. Up to five different masks can be exchanged to define the latent images of the microoptical elements with the five different exposure geometries. Each of the exchanged masks can have mask holes inclined in one of the five different exposure directions in order to image a different optical surface of a plurality of the microoptical elements. The microoptical elements can be made in the photoresist material (e.g., PMMA). Alternatively, the developed photoresist can provide a mold pattern that can be transferred to other optical materials (e.g., glass or an injection molded polymer)

Figure 3B:
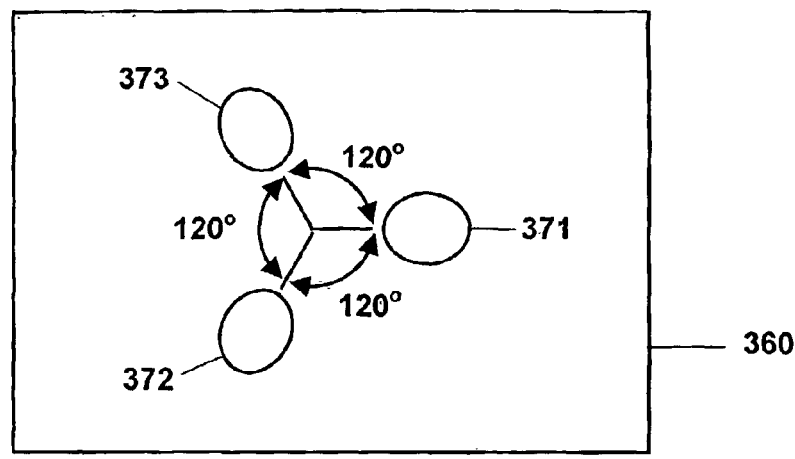
FIG. 3B shows a schematic top view of the master mask.
Figure 3A:
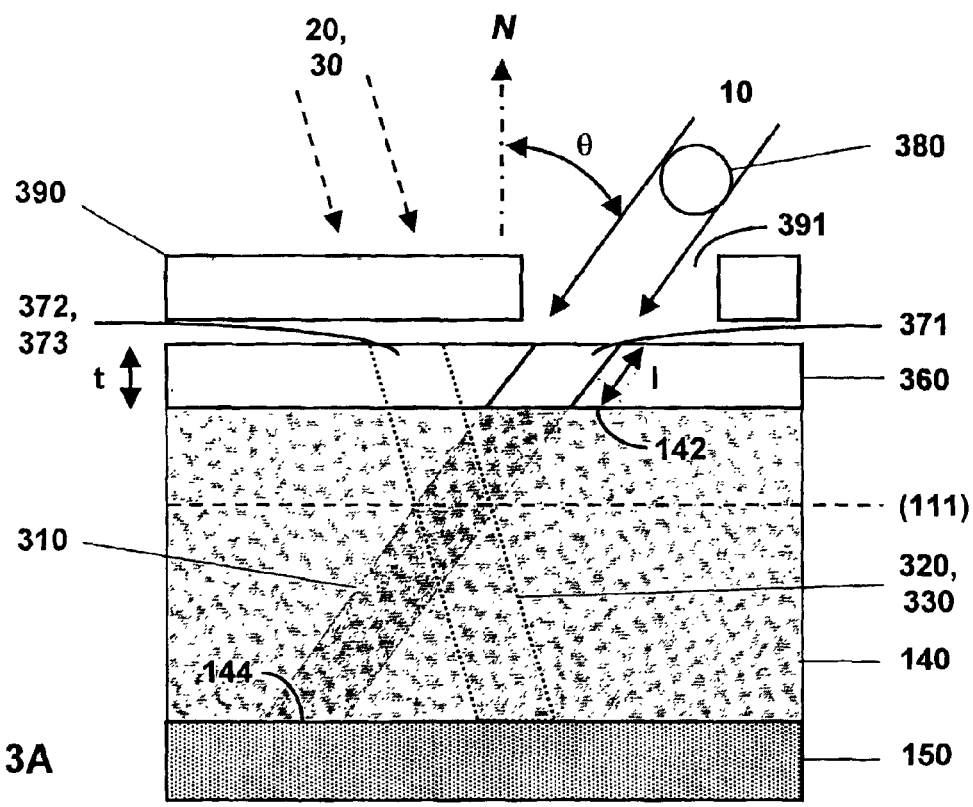
FIG. 3A shows a schematic elevation view of the latent images of circular cylinder holes defined in a photoresist layer using three consecutive off-normal DXRL exposures through openings in a selection mask that selects one of three separate inclined elliptical mask holes in a master mask for each exposure.

In FIG. 3A is shown another embodiment of the present invention, comprising the method of using a selection mask 390 to select a particular mask hole or a plurality of similarly-inclined mask holes and block the beam from passing through the non-aligned mask holes in a master mask 360 for each exposure in a series of consecutive exposures. Therefore, the master mask 360 can be patterned to contain all of the information to be imaged onto the photoresist layer 140. By using a movable or replaceable selection mask 390, repositioning or exchange of the master mask 360 between exposures is unnecessary, thereby eliminating the likelihood of accrued misalignment of the mask holes.

To image the Yablonovite structure, the master mask 360 can be patterned to contain a separate mask hole 371, 372, and 373 for each of the criss-crossing cylinders to be imaged. Therefore, the configuration shown in FIG. 3B contains the three mask holes 371, 372, and 373 necessary to define three cylinders, each representing a <110>, <101>, or <011>direction of the diamond-like lattice. The Yablonovite master mask would consist of a triangular array of such three-hole configurations (i.e., the master mask 360 for the method shown in FIG. 3 would contain three times the number of mask holes contained in the mask 260 used to image an equivalent Yablonovite crystal using the method shown in FIG. 2). The mask holes 371, 372, and 373 can be separated one from another by a distance of $\sqrt{2}/2$ times an fcc lattice period in a plane midway between the (111) nodal planes of the Yablonovite crystal. With the master mask 360 patterned to represent this mid-plane, the separated mask holes 371, 372, and 373 are inclined 35.26° to the surface normal N but spread out 120° away from each other. The mask holes 371, 372, and 373 can each be elongated in a different azimuthal direction according to Eq. (3) to compensate for geometric distortion due to the off-normal incidence of the beams 10, 20, and 30. A circular cross-section 380 can thereby be obtained for each of the cylindrical latent images 310, 320, and 310.

To image the Yablonovite structure according to the method depicted in FIG. 3, the master mask 360 is positioned over the photoresist layer 140. A selection mask 390 can be used to sequentially select one of the mask holes 371, 372, or 373 in the master mask 360 for each of the consecutive X-ray beam exposures. The selection mask 390 can have an opening 391, such that the first beam 10 is allowed to pass through the opening 391 and the first mask hole 371, yet is blocked by the absorbing regions of the selection mask 390 from passing through the other mask holes 372 and 373 in the master mask 360. With the selection mask 390 first positioned to have the first opening 391 over the first mask hole 371, a first exposure can be taken with the first beam 10 aligned with the first mask hole 371 (i.e., at 35.25° to the surface normal N in the <110>direction) to define a first latent image 310 in the photoresist layer 140. The first selection mask 390 can then be repositioned to provide an opening for the second beam 20 to pass through the second mask hole 372, but be blocked by the absorbing regions of the repositioned selection mask 390 from passing through the other mask holes 371 and 373. The opening for the second beam in the first selection mask 390 can be the repositioned first opening 391 or a separate second opening (not shown) that is over an absorbing region of the master mask 360 when the master mask 360 is in the first position. Alternatively, the first selection mask 360 can be exchanged with a second selection mask (not shown) that has an opening for the second mask hole 372, but that blocks the beam from passing through the other mask holes. In either case, repositioning or exchange of the master mask 360 is avoided.

A second exposure can then be taken with the second beam 20 aligned with the second mask hole 372 (i.e., at 35.25° to the surface normal N in the <101>direction) to define a second latent image 320 in the photoresist 140. After the second exposure, the selection mask 390 can again be repositioned to provide an opening 393 above the third mask hole 373 of the master mask 260, yet blocking the other mask holes 371 and 372. A third exposure can then be taken with a third beam 30 aligned to the third mask hole 373 (i.e., at 35.25° to the surface normal N in the <011>direction) to define a third latent image 330 in the photoresist 140. Because each of the three mask holes 371, 372, and 373, each corresponding to a different crystal direction <110>, <101>, or <011>, can be separated in the master mask 360, the (111) plane of the Yablonovite crystal does not have to be in the plane of the master mask 360.

Again, the exposed photoresist can be developed to leave a mold of criss-crossing air cylinders. The air holes can be filled with a metallic or high-refractive-index material and the developed photoresist removed to replicate an inverse Yablonovite structure. Additionally, this inverse Yablonovite structure can further be used as a mold to replicate a Yablonovite structure.

This masking process is preferred when the lateral features of the microstructure are large relative to the mask thickness, but with mask holes separated widely enough on the master mask so that the selection mask can be easily positioned to select the desired mask hole for each exposure.

Figure 4B:
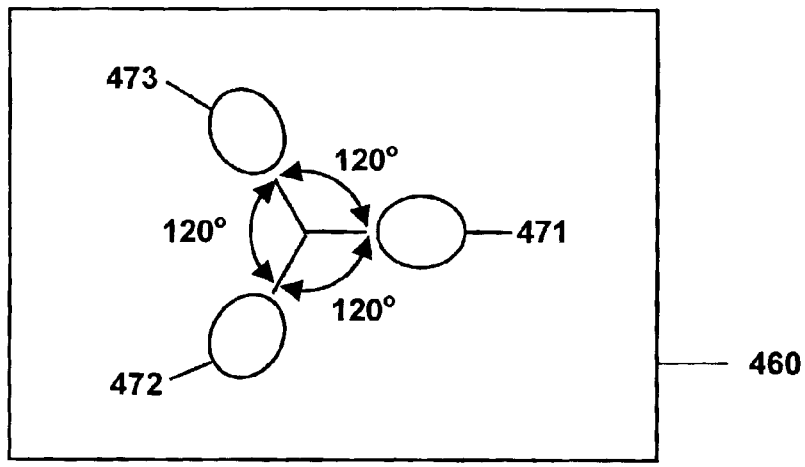
FIG. 4B shows a schematic top view of the enhanced mask.
Figure 4A:
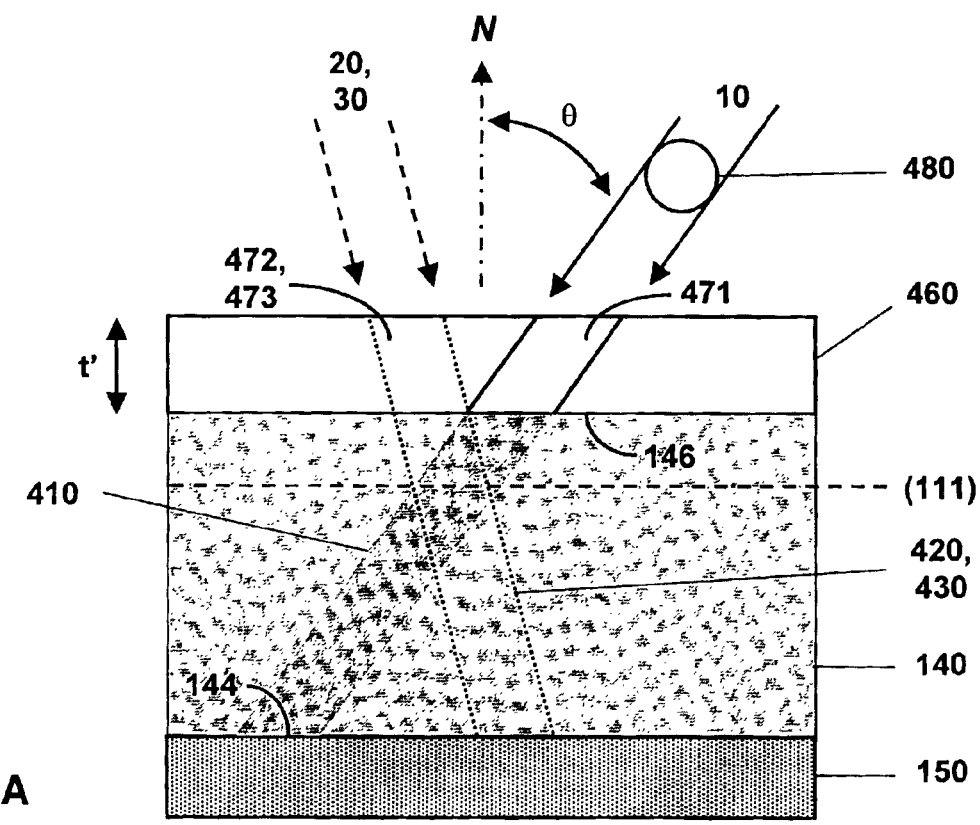
FIG. 4A shows a schematic elevation view of the latent images of circular cylindrical holes defined in a photoresist layer using three consecutive off-normal DXRL exposures through separate inclined elliptical mask holes in an enhanced mask.

In FIG. 4A is shown another embodiment of the present invention, comprising the method of using a thick absorber to attenuate radiation passing through the region of the non-aligned mask holes. In this embodiment, advantage is taken of the absorber shadowing by making the enhanced mask sufficiently thick so that the extra absorber material blocks the radiation passing obliquely through those mask holes that are not aligned with the incident beam direction. The mask holes for each exposure geometry are, in effect, selected by the beam-hole alignment, eliminating the need for a selection mask.

An enhanced mask 460 can be patterned to contain all of the information to be imaged onto the photoresist 140, eliminating the need to reposition or exchange the enhanced mask 460 after consecutive exposures. To image the Yablonovite structure, the enhanced mask 460 can be patterned to contain a separate mask hole for each of the crystallographic directions to be imaged. As described in relation to the method depicted in FIG. 3, the mask holes 471, 472, and 473 necessary to individually define each cylinder can be separated one from another in a plane between the (111) planes of the diamond-like lattice. With the enhanced mask 460 patterned to represent a mid-plane, the separated mask holes 471, 472, and 473 are inclined 35.26° to the surface normal N but spread out 120° away from each other. The mask holes 471, 472, and 473 can be elongated in different azimuthal directions to compensate for geometric distortion due to the off-normal exposure and provide a circular cross-section 480 for each of the cylindrical latent images 410, 420, and 430.

To image the Yablonovite structure according to the method depicted in FIG. 4, the enhanced mask 460 is positioned over the photoresist layer 140. A first exposure can then be taken with the first beam 10 aligned with the first mask hole 471 (i.e., at 35.25° to the surface normal N in the <110>direction) to define a first latent image 410 in the photoresist 140. The absorber material of the enhanced mask 460 is sufficiently thick so as to block the radiation of the first beam 10 that passes obliquely through the non-aligned mask holes 472 and 473.

The beam can then be re-aligned in the direction of the second mask hole 472. A second exposure can then be taken with the second beam 20 (i.e., at 35.25° to the surface normal N in the <101>direction) to define a second latent image 420 in the photoresist layer 140. The thick absorber blocks the beam 20 that passes obliquely through the non-aligned mask holes 471 and 473. The beam can be re-aligned again with the third mask hole 473 and a third exposure can then be taken with the third beam 30 to define a third latent image 430. Because each of the three mask holes 471, 472, and 473, corresponding to the three crystal directions <110>, <101>, and <011>, are separated in the mask 460, the (111) plane of the Yablonovite crystal need not be in the plane of the mask 460.

Again, the exposed photoresist can be developed to leave a mold of criss-crossing air cylinders. The air holes can be filled with a metallic or high-refractive-index material and the developed photoresist removed to replicate an inverse Yablonovite structure. Additionally, this inverse Yablonovite structure can further be used as a mold to replicate a Yablonovite structure.

This masking process is preferred for fabricating microstructures having features with lateral dimensions that are small relative to the thickness of the mask.

The requirements of the X-ray absorber for the various masking processes and exposure geometries described above are dictated by the exposure contrast required. Preferably, the exposure contrast is 10 or greater. The absorber thickness necessary to obtain a required exposure contrast for a given set of X-ray source parameters, support membrane thicknesses, and photoresist thickness can be obtained using standard models of X-ray attenuation in matter. For example, such an attenuation model is available on-line from the Center for X-Ray Optics (CXRO) at the Lawrence Berkeley National Laboratory (LBL) at <http://www.cxro.lbl.gov>.

Consider the masking processes and exposure geometries for the methods shown in FIGS. 1–3. Determination of the absorber thickness for these methods can be illustrated by an exposure example. For this example, an exposure contrast of 20, a silicon nitride support membrane having a thickness of 1 $\mu$m, and a 100-$\mu$m-thickness PMMA photoresist layer were assumed.

Furthermore, the example assumed that the X-ray source is the synchrotron radiation source at the Center for Advanced Microstructure Devices (CAMD) at Louisiana State University. The CAMD synchrotron was assumed to have an electron energy of 1.3 GeV, 100 mA beam current, and a magnetic field of 1.49 Tesla. These ring parameters provide a collimated X-ray beam having a peak flux of about $3 \times 10^{12}$ photons/sec/mr²/0.1% BW at 1 keV X-ray energy. The exposure chamber was assumed to have a 37-$\mu$m-thickness beryllium vacuum window.

To image a 3D microstructural feature, the X-ray beam passes through the mask and photoresist layer at an off-normal angle of incidence $\theta$. Therefore, the attenuation length l of the absorber is given by $$l = t/\cos\theta \quad (4)$$

where t is the absorber thickness. Similar pathlength corrections were made to the support membrane and photoresist layer thicknesses to provide attenuation lengths for use in the attenuation model.

Figure 5:
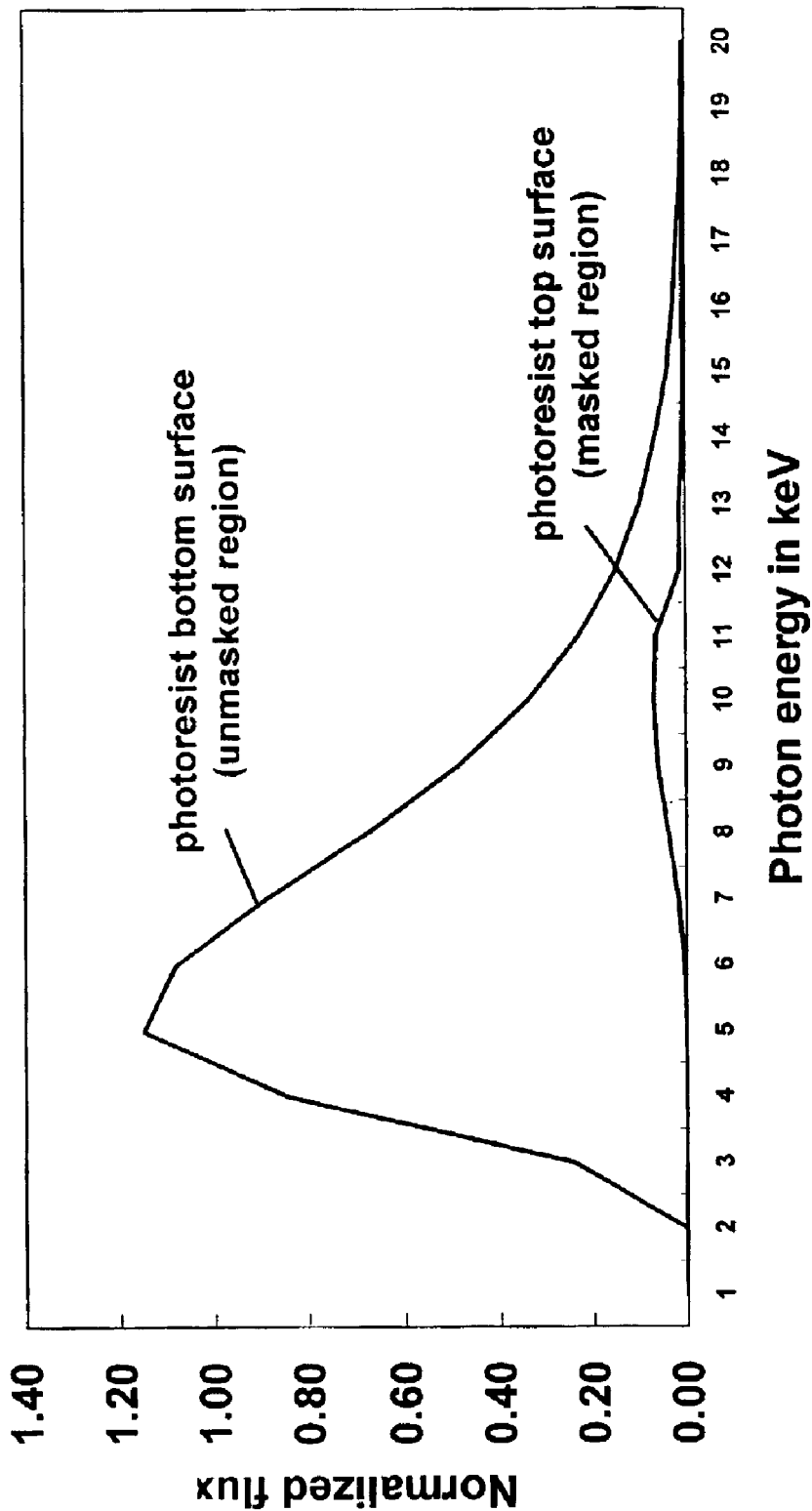
FIG. 5 shows the photon flux versus photon energy at the photoresist bottom surface in the unmasked exposed region and at the photoresist top surface in the masked unexposed region for an exposure example.

The exposure contrast for an aligned exposure is the exposure dose (kJ/cm²) at the photoresist bottom surface in the unmasked exposed regions (i.e., at bottom surface 144 in FIGS. 1–3) divided by the exposure dose delivered to the photoresist top surface in the unexposed regions under the absorber (i.e., at top surface 142 in FIGS. 1–3). In FIG. 5 are shown the normalized photon flux versus photon energy (in eV) at the bottom surface 144 of the PMMA photoresist layer in the unmasked exposed region and at the PMMA photoresist top surface 142 in the unexposed regions under a 6-$\mu$m-thick gold absorber (i.e., an attenuation length l of about 7.3 $\mu$m). The exposure contrast is the ratio of the areas (i.e., the integral of the photon flux with respect to photon energy) under the two curves in FIG. 5. For a single exposure, the exposure contrast for the 6-$\mu$m-thick gold absorber is about 20.

Note that the method for fabricating Yablonovite shown FIGS. 1 and 2 requires three consecutive exposures through the same mask hole. Therefore, the exposure contrast after three exposures using the single-mask-hole method can be about one-third of the contrast for a single exposure.

Figure 6:
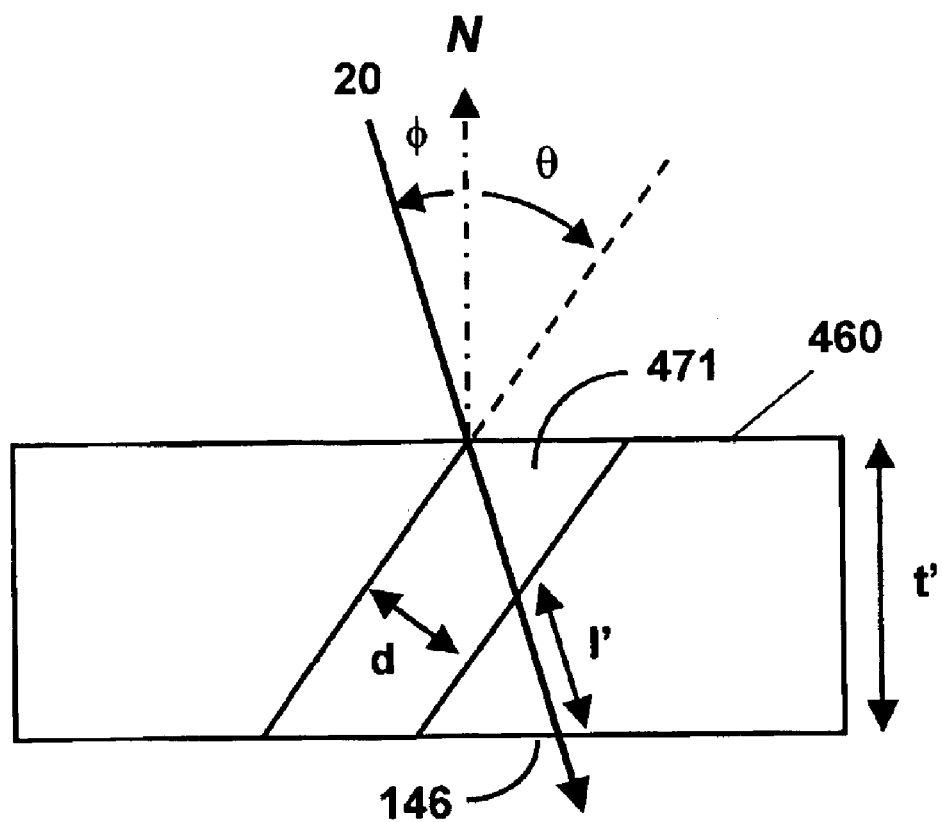
FIG. 6 shows the exposure geometry for a beam passing obliquely through a non-aligned mask hole in an enhanced mask, using the method depicted in FIG. 4.

Now consider the masking process and exposure geometry for the method shown in FIG. 4. This method relies upon a thick absorber to attenuate radiation passing through the region of the non-aligned mask holes. In FIG. 6 is shown a depiction of a beam 20 passing at an angle $\phi$ to the surface normal N through the region of a single non-aligned mask hole 471 in an enhanced absorber 460 of thickness t'. The mask hole 471 is inclined at angle $\theta$ to the surface normal N and has a cross-sectional dimension d.

The minimum attenuation length l' in the enhanced absorber 460 for a beam 20 that passes obliquely through the non-aligned mask hole 471 is given by:

$$l' = t'/\cos\phi - d/\sin(\theta+\phi) \quad (5)$$

The thickness t' for the enhanced mask 460 necessary to obtain the a desired attenuation length can be obtained by rearranging Eq. (5) and solving for t' according to:

$$t' = \cos\phi[l' + d/\sin(\theta+\phi)] \quad (6)$$

Consider the absorber thickness of a master mask used to fabricate a Yablonovite structure having circular hole with diameter d=2 $\mu$m and the parameters for the exposure example described above. Using the method depicted in FIGS. 1, 2, or 3, the required gold absorber thickness is t=6 $\mu$m for the mask 160, 260, or 360. This absorber thickness provides an attenuation length of l~7.3 $\mu$m according to Eq. (4) and an exposure contrast of 20 for a single off-normal exposure at a tilt angle of $\theta$=35.26°. The absorber thickness t' required to provide the same attenuation length (i.e., l'~7.3 $\mu$m) for a beam 20 passing through the enhanced mask 460 in the region of a non-aligned hole 471 using the method depicted in FIGS. 4 and 6 can be obtained according to Eq. (6). To image the Yablonovite structure, $\phi$ is the projection angle of the non-aligned exposure beam 20 onto the plane of the first exposure beam 10 (i.e., $\phi$=19.5° for the Yablonovite exposure geometry). From Eq. (6), the required absorber thickness for the enhanced mask 460 is t'~8.5 $\mu$m. As will be apparent, a similar procedure can be used to determine the absorber thickness when the beam passes through more than one non-aligned mask holes.

The 3D mask can be fabricated according to methods known to those in the lithography art. A thin X-ray mask can be used to expose thin photoresist layers 140. The X-ray mask can be fabricated by an additive technique, in which a template resist several microns thick is defined on a support membrane (e.g., by a UV optical microlithographic transfer through a chromium mask) to provide for through-mask deposition of the mask absorber material (e.g., electroplated gold). The template resist can be patterned to provide inclined and elongated holes in the X-ray mask.

For thick photoresist layers 140, harder X-rays must be used to define the high-aspect-ratio features of a 3D microstructure, requiring a thicker absorber layer to obtain adequate contrast with a DXRL exposure. For absorber thicknesses of greater than about 3 $\mu$m, a two-step mask fabrication process can be used. The two-step process typically uses an intermediate mask with X-ray mask transfer into a thick template resist and absorber material deposition to provide a high contrast master mask with a precise mask pattern.

In FIG. 7 is shown an improved multi-layer resist process for fabricating an X-ray mask 700 whereby the intermediate and master mask are fabricated on the same support membrane. Mask fabrication on a common support membrane greatly improves the accuracy of pattern transfer from the intermediate mask to the master mask, thereby enabling the definition of precise 3D microstructures.

Figure 7A:
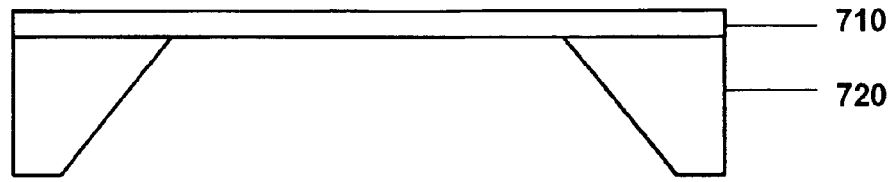
FIG. 7A shows the support membrane on a mask frame.

In FIG. 7A, a support membrane 710 is provided on a mask frame 720. The support membrane 710 can typically be a low-atomic-number material, such as beryllium, carbon, boron nitride, boron carbide, silicon, silicon nitride, or silicon carbide that is substantially transparent to the characteristic X-rays of the DXRL process. The mask frame 720 provides a means for handling of the mask 700 and attachment of the mask 700 to the photoresist-coated substrate 150. The support membrane 710 can be a thin (e.g., 1-$\mu$m-thickness), stress-controlled silicon nitride layer that is low-pressure chemically vapor deposited (LPCVD) on a substrate. The substrate is preferably a monocrystalline silicon wafer with a thickness of 400–500 $\mu$m, but can also be glass, crystalline quartz, ceramic, or the like. The silicon substrate can be back-etched, using integrated circuit processing, to provide the mask frame 720 with an opening for passage of the DXRL X-rays through the support membrane 710. For example, the silicon substrate can be back-etched using an anisotropic wet etchant, such as potassium hydroxide, tetramethyl ammonium hydroxide, ethylenediamine pyrocatechol or the like, to provide an etched cavity on the backside of the support membrane 710.

Figure 7B:
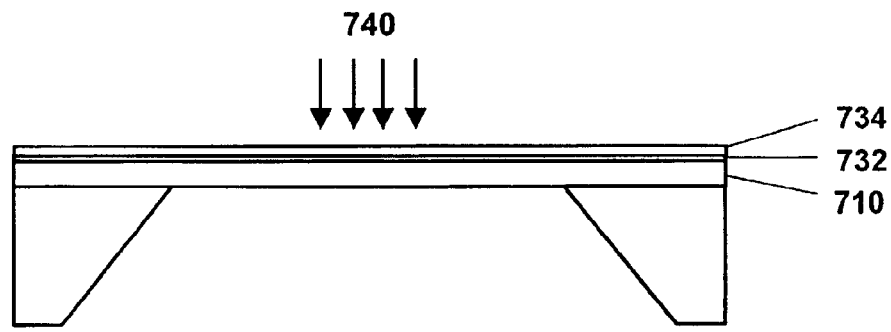
FIG. 7B shows the lithographic patterning of a first photoresist layer on the frontside of the support membrane.

In FIG. 7B, a plating base 732 can be vapor deposited on a surface of the support membrane 710 for subsequent electroplating of a first absorber layer 730. The plating base 732 is preferably deposited on the frontside of the support membrane 710, opposite the mask frame 720. The plating base 732 can be a thin (e.g., less than 50-nm-thickness), electrically conductive layer of titanium/gold, or the like.

A thin, first photoresist layer 734 is then applied to the surface of the plating base 732. For example, the first photoresist layer 734 can be applied by spin-coating. The first photoresist layer 734 can be either a positive-tone resist (e.g., PMMA) or a negative-tone resist (e.g., SU-8 epoxy). The first photoresist layer 734 should be thick enough to provide a first absorber height having sufficient contrast for accurate pattern transfer to second photoresist layer 764 is used to form the master mask. The first photoresist layer 734 can preferably have a thickness of 0.1 to 2 $\mu$m and, more preferably, be about 0.25 $\mu$m in thickness.

The first photoresist layer 734 can then be patterned to provide for subsequent pattern transfer to the second photoresist layer 764. The first photoresist layer 734 can be patterned using lithographic processes used in the integrated circuits industry. Current commercially available optical lithographic steppers can produce feature sizes of 130–180 nm over a 12-inch wafer and are projected to be able to produce less than 100 nm feature sizes by the year 2003. The first photoresist layer 734 is preferably patterned by high precision electron-beam lithography. Because resolution is not limited by diffraction effects, minimum line widths of less than 80 nm with edge roughness of less than 20 nm can be achieved in a thin resist with high energy electron beams. See, e.g., A. Schmidt et al., "High precision mask fabrication for deep X-ray lithography using 40-kV shaped electron beam lithography", *Microelectronic Engineering* 57, 761 (2001). Therefore, submicron patterns with small corner radii and precise shape control can be obtained by direct writing with an electron beam 740 in the first photoresist layer 734.

Figure 7C:
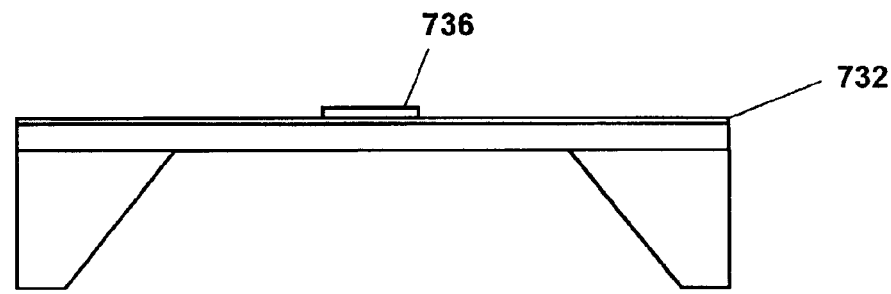
FIG. 7C shows the photoresist structure remaining after development of the patterned first photoresist layer.

In FIG. 7C, after writing of the desired pattern in the first photoresist layer 734, the exposed regions (i.e., of a positive resist) or the unexposed regions (i.e., of a negative photoresist) can be removed by a suitable developer. For example, direct electron beam writing 740 into the negative photoresist 734 leaves a photoresist structure 736 after development.

Figure 7D:
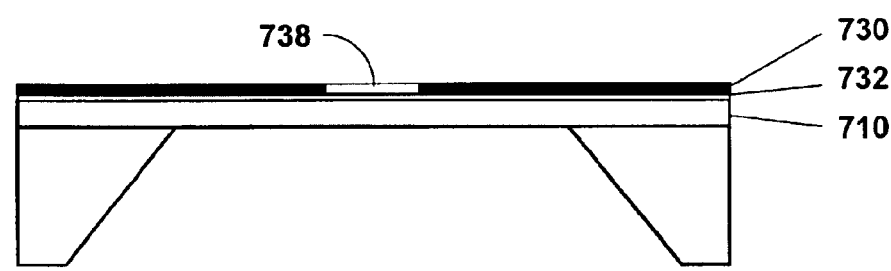
FIG. 7D shows the deposition of a first absorber layer into the removed regions of the first photoresist layer, providing the intermediate mask.

In FIG. 7D, a first absorber material is deposited into the removed regions of the first photoresist layer 734. The absorber material can be gold that is electroplated onto the plating base 732 in the void regions. The thickness of the first absorber layer 730 can be slightly less than the thickness of the first photoresist layer 734 (e.g., about 0.25-$\mu$m-thickness). At least one mask hole 738 is thereby provided in the intermediate mask.

Figure 7E:
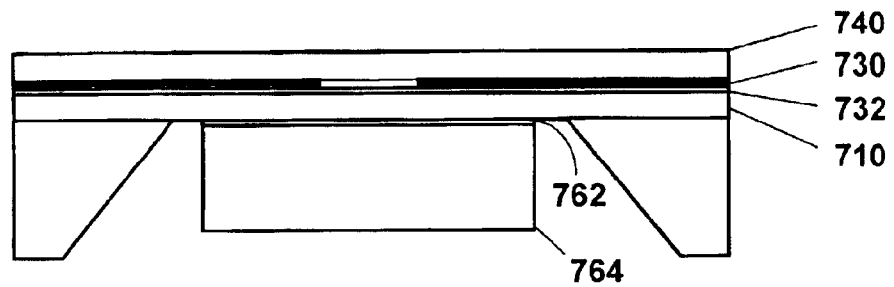
FIG. 7E shows a second negative photoresist layer on the backside of the support membrane.

In FIG. 7E, a frontside isolation photoresist 740 can be applied to the intermediate mask to protect the patterned first absorber layer 730 during subsequent processing. A second plating base 762 and a thick, second photoresist layer 764 can then be applied to a side of the support membrane 710. Preferably, the second plating base 762 and the second photoresist layer 764 are applied to the backside of the support membrane 710, opposite the intermediate mask. The second photoresist layer 764 is a negative-tone resist, such as an SU-8 epoxy. The thickness of the second photoresist layer 764 will be determined by the contrast desired in the thick photoresist 140, the thickness of the intermediate mask absorber 730, and the DXRL beam parameters. For a 0.25-$\mu$m-thickness gold first absorber 730, the thickness of the second photoresist layer 764 can be about 3 $\mu$m.

Figure 7F:
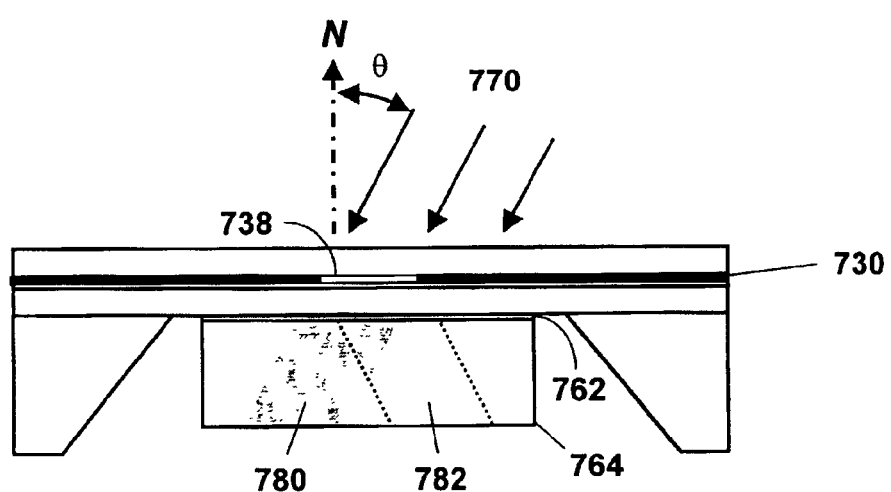
FIG. 7F shows the patterning of the second photoresist layer by blanket X-ray exposure through the intermediate mask.

In FIG. 7F, the intermediate mask pattern can be transferred to the second photoresist layer 764 by a blanket irradiation with a collimated X-ray beam 770 through the at least one mask hole 738 of the patterned first absorber 730 at an angle of inclination $\theta$ relative to the surface normal N of the support membrane. A first latent image 780 is thereby defined in the second photoresist layer 764. Additional DXRL exposures can be used to define differently inclined latent images to enable multidirectional inclined microstructures. For example, a second X-ray exposure (not shown) at second inclination angle, either through the same at least one mask hole 738 or through other mask holes in the intermediate mask, can define a second latent image 782 in the second photoresist layer 764. If the second X-ray exposure is through mask holes other than the first mask hole(s), the first mask hole(s) can be blocked during the second exposure by a selection mask (not shown), as was described in reference to FIG. 3.

Figure 7G:
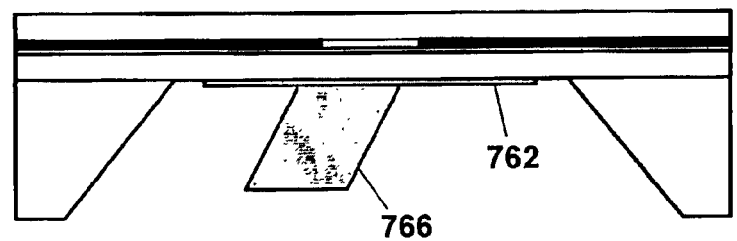
FIG. 7G shows the photoresist structure remaining after development of the patterned second photoresist layer.

In FIG. 7G, the unexposed regions of the negative second photoresist layer 734 can be removed with a suitable developer to leave a photoresist structure 766.

Figure 7H:
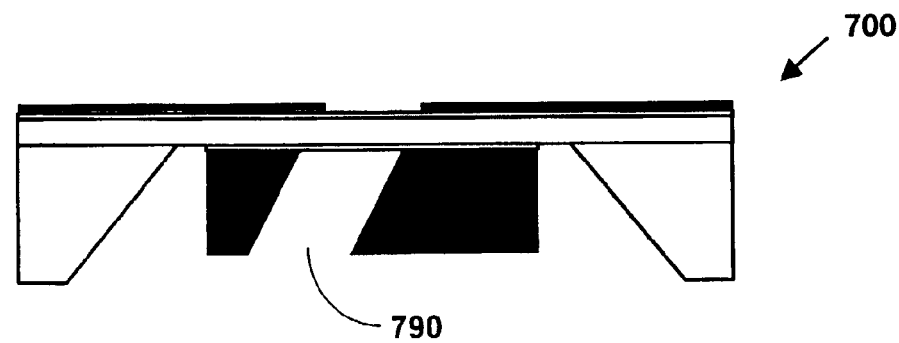
FIG. 7H shows the deposition of a second absorber layer into the removed regions of the second photoresist layer, providing the X-ray mask.

In FIG. 7H, the removed regions of the second photoresist layer 734 can be filled with a second absorber material. The absorber material can be gold that is electroplated onto the second plating base 762 in the void regions. The remaining photoresist structures 736 and 766 and the frontside isolation photoresist 740 can then be removed to provide the X-ray mask 700 having at least one inclined mask hole 790. Additionally, the plating bases 732 and 762 can be removed with a selective etchant.

The steps depicted in FIGS. 7E–7H can be repeated to build up the absorber thickness to provide additional contrast for the enhanced mask, if required. Alternatively, the mask pattern of the X-ray mask 700 can be transferred to one or more additional X-ray masks.

It will be understood that the above description is merely illustrative of the applications of the principles of the present invention, the scope of which is to be determined by the claims viewed in light of the specification. The invention has been described as improved methods for masking processes and exposure geometries for the fabrication of 3D microstructures by DXRL. Other variants and modifications of the invention will be apparent to those of skill in the art. In particular, although the methods of the present invention have been described in relation to the fabrication of a Yablonovite photonic crystal, it will be apparent to those skilled in the art that the various masking processes and exposure geometries described herein are generally applicable to the fabrication of 3D microstructures having features of arbitrary cross-section and orientation.

We claim:

1. A method for fabricating a three-dimensional microstructure, comprising:
   providing a photoresist layer on a substrate;
   positioning a patterned first mask proximate the surface of the photoresist layer, the first mask comprising an absorber layer with at least one mask hole that is inclined at an angle $\theta$ relative to a surface normal of the first mask;
   exposing the photoresist layer through the at least one mask hole to a first beam of collimated radiation that is substantially aligned with the angle of inclination $\theta$ of the at least one mask hole, thereby defining at least one latent image in the photoresist layer; and
   developing the photoresist layer to selectively remove or not remove the exposed regions of the photoresist layer to provide the three-dimensional microstructure.

2. The method of claim 1, wherein the at least one mask hole is elongated in the plane of the first mask in the direction of the first beam of collimated radiation to compensate for the geometric distortion of the at least one latent image in the photoresist layer caused by the first beam of collimated radiation passing through the at least one mask hole at the angle of inclination $\theta$.

3. The method of claim 2, wherein the at least one latent image comprises a circular cylinder and the at least one mask hole comprises an ellipse.

4. The method of claim 2, wherein the at least one latent image comprises a square rod and the at least one mask hole comprises a parallelogram.

5. The method of claim 1, further comprising repositioning the first mask to a second position, proximate the surface of the photoresist layer, after the exposing step and exposing the photoresist layer through the at least one mask hole to a second beam of collimated radiation that is substantially aligned with the angle of inclination $\theta$ of the at least one mask hole in the second position of the first mask, thereby defining at least one additional latent image in the photoresist layer.

6. The method of claim 1, further comprising replacing the first mask with a patterned second mask that is proximate the top surface of the photoresist layer, the second mask comprising an absorber layer with at least one mask hole that is inclined at either a different tilt or rotation angle or both relative to a surface normal of the second mask and exposing the photoresist layer through the at least one mask hole to a second beam of collimated radiation that is substantially aligned with the different angle of inclination of the at least one mask hole, thereby defining at least one additional latent image in the photoresist layer.

7. The method of claim 1, further comprising exposing the photoresist layer to a second beam of collimated radiation through at least one additional mask hole in the absorber layer of the first mask, wherein the at least one additional mask hole is inclined at either a different tilt or rotation angle or both relative to the surface normal of the first mask and wherein the second beam of collimated radiation is substantially aligned with the different angle of inclination of the at least one additional mask hole, thereby defining at least one additional latent image in the photoresist layer.

8. The method of claim 7, further comprising positioning a first selection mask having at least one opening above the first mask to block the at least one additional mask hole prior to the step of exposing the photoresist layer to the first beam of collimated radiation through at least one of the openings in the first selection mask and the at least one mask hole in the first mask.

9. The method of claim 8, further comprising repositioning the first selection mask above the first mask to block the at least one mask hole prior to the step of exposing the photoresist layer to the second beam of collimated radiation through at least one of the openings in the first selection mask and the at least one additional mask hole in the first mask.

10. The method of claim 8, further comprising exchanging the first selection mask with a second selection mask having at least one opening above the first mask to block the at least one mask hole prior to the step of exposing the photoresist layer to the second beam of collimated radiation through the at least one opening in the second selection mask and the at least one additional mask hole in the first mask.

11. The method of claim 7, wherein the absorber layer is sufficiently thick to substantially block the first beam of collimated radiation from passing through the at least one additional mask hole that is not aligned with the first beam.

12. The method of claim 7, wherein the absorber layer is sufficiently thick to substantially block the second beam of collimated radiation from passing through the at least one mask hole that is not aligned with the second beam.

13. The method of claim 1, further comprising filling the removed regions of the photoresist layer with a first replicating material.

14. The method of claim 13, further comprising removing the photoresist layer to provide a negative replica of the three-dimensional microstructure comprising the first replicating material.

15. The method of claim 14, further comprising filling the removed regions of the negative replica with a second replicating material.

16. The method of claim 15, further comprising removing the first replicating material to provide a positive replica of the three-dimensional microstructure comprising the second replicating material.

17. A method for fabricating an X-ray mask, comprising:
  a) forming a support membrane that is substantially transparent to the X-rays on a mask frame,
  b) applying a first photoresist layer to a first side of the support membrane,
  c) patterning the first photoresist layer with a lithographic process,
  d) removing the exposed or unexposed regions of the first photoresist layer,
  e) filling the removed regions of the first photoresist layer with a first absorbing material to form a patterned intermediate mask having at least one mask hole,
  f) applying a negative second photoresist layer to a side of the support membrane,
  g) patterning the negative second photoresist layer by exposing the second photoresist layer to a first collimated X-ray beam through at least one mask hole of the intermediate mask, wherein the first collimated X-ray beam is inclined at an angle of inclination $\theta$ to the surface normal of the support membrane,
  h) removing the unexposed regions of the second photoresist layer,
  i) filling the removed regions of the second photoresist layer with a second absorbing material, and
  j) removing the exposed regions of the second photoresist layer to form the X-ray mask.

18. The method of claim 17, wherein the steps f) through j) are repeated at least once.

19. The method of claim 17, further comprising exposing the second photoresist layer to a second collimated X-ray beam through at least one mask hole in the intermediate mask, wherein the second collimated X-ray beam is inclined at either a different tilt or rotation angle or both relative to the surface normal from the first collimated X-ray beam.

20. The method of claim 19, wherein the at least one mask hole in the intermediate mask for the second exposure is different from the at least one mask hole in the intermediate mask for the first exposure and wherein the at least one mask hole for the first exposure is blocked during the second exposure by a selection mask.

21. The method of claim 20, wherein the at least one mask in the intermediate mask for the second exposure is blocked during the first exposure by a selection mask.

22. The method of claim 17, wherein the lithographic process comprises optical lithography.

23. The method of claim 17, wherein the lithographic process comprises direct electron beam writing.

24. The method of claim 17, wherein the second photoresist layer is applied to the side of the support membrane opposite the first side.

25. The method of claim 17, further comprising depositing a first plating base of an electrically conductive material on the first side of the support membrane prior to step b).

26. The method of claim 17, further comprising depositing a second plating base of an electrically conductive material on the opposite side of the support membrane prior to step f).

27. The method of claim 25, wherein the filling step e) comprises electroplating the first absorbing material onto the first plating base in the removed regions of the first photoresist layer.

28. The method of claim 26, wherein the filling step j) comprises electroplating the second absorbing material onto the second plating base in the removed regions of the second photoresist layer.

29. An X-ray mask, comprising:
  a support membrane that is substantially transparent to the X-rays,
  a patterned first absorber layer having at least one mask hole on a first side of the support membrane,
  a patterned second absorber layer on the other side of the support membrane, the second absorbing layer having at least one mask hole that is concentric with has the same shape as the at least one mask hole in the first absorber layer, and is inclined at an angle of inclination $\theta$ relative to the surface normal of the support membrane.

* * * * *